United States Patent [19]

Bray

[11] 4,227,230
[45] Oct. 7, 1980

[54] SWITCH MODE DRIVER

[75] Inventor: William E. Bray, Houston, Tex.

[73] Assignee: Texas Instruments Incorporated, Dallas, Tex.

[21] Appl. No.: 943,822

[22] Filed: Sep. 19, 1978

[51] Int. Cl.³ .............................................. H01H 47/32
[52] U.S. Cl. .................................... 361/152; 361/191
[58] Field of Search ........................ 361/152, 154, 191

[56] References Cited

U.S. PATENT DOCUMENTS

| | | | |
|---|---|---|---|
| 3,789,272 | 1/1974 | Vollhardt | 361/154 |
| 3,909,681 | 9/1975 | Campari et al. | 361/154 |
| 4,041,546 | 8/1977 | Stewart | 361/152 |
| 4,059,844 | 11/1977 | Stewart | 361/152 |

Primary Examiner—Harry E. Moose, Jr.
Attorney, Agent, or Firm—Thomas G. Devine; Leo N. Heiting; Melvin S. Sharp

[57] ABSTRACT

A switch mode driver for a wire matrix printer employs a single power switch circuit to connect one or more solenoids across a DC source or power and to disconnect those solenoids from that source. Enable signals are provided to select any one or all of the solenoids, such enable signals remaining for a predetermined time during which a slewing period, followed by a chopping period, occur and after which energy remaining in the selected solenoids is returned to the DC power source. The initial ramping of current through the selected solenoids occurs when the power switch circuit is closed for a time period determined by an RC circuit, such time period defining the slewing period. Then the power switch opens and the chopping period begins. The charge on the capacitor of the RC circuit is discharged and at a certain voltage point, the power switch is again closed until the charge on the capacitor of the RC circuit again reaches a predetermined voltage at which time the power switch opens. This chopping action continues until the enabling signals are disabled. In this preferred embodiment, the time when the power switch is turned on is approximately 1/10 of the chopping period.

12 Claims, 1 Drawing Figure

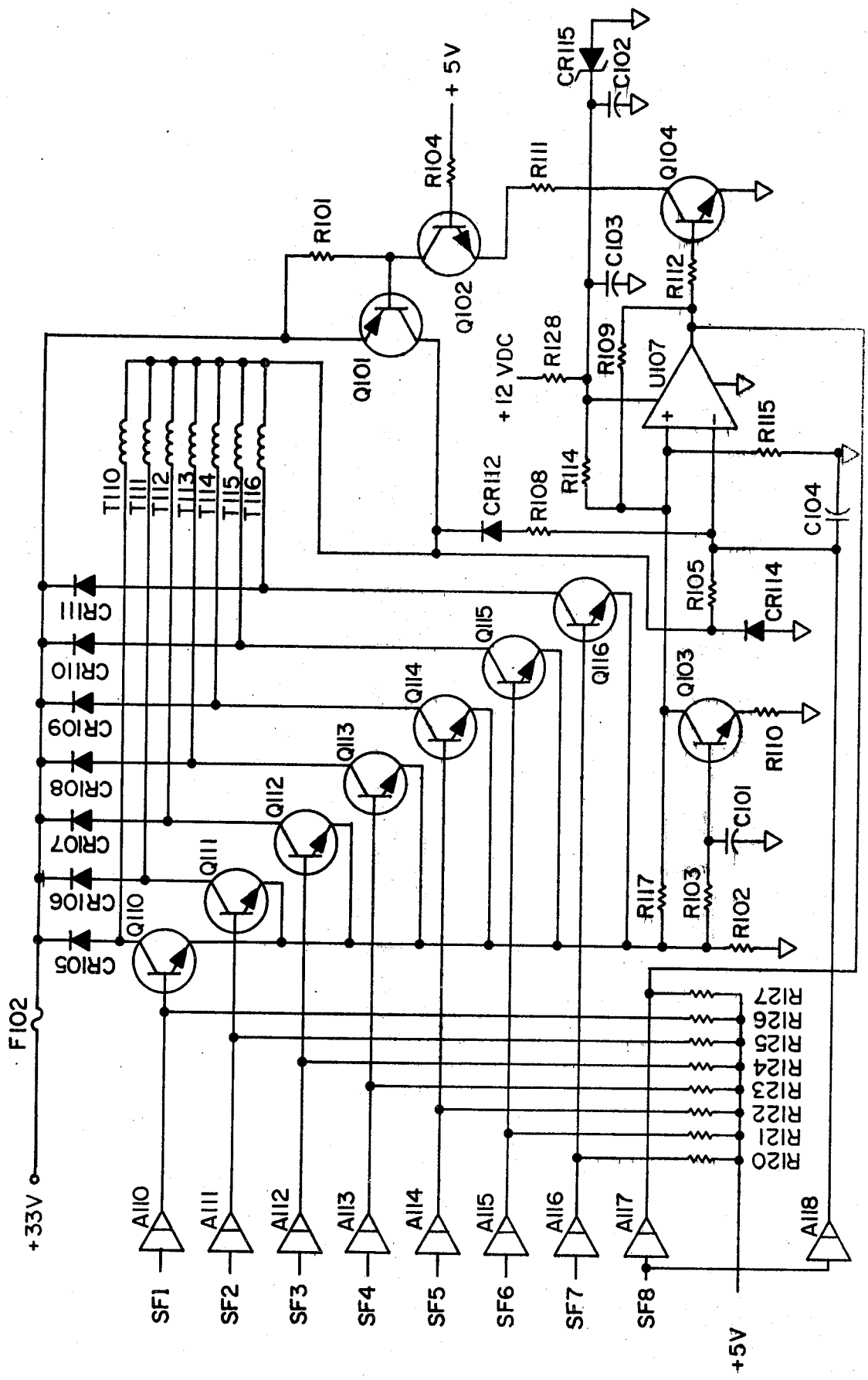

SWITCH MODE DRIVER

BACKGROUND OF THE INVENTION

1. Field of the Invention

This invention is directed to a printhead driver for a wire matrix printer and particularly to a switching regulator type driver for driving one or more solenoids simultaneously, the armatures of such solenoids driving the corresponding print needles.

2. Description of the Prior Art

Prior art wire matrix solenoid drivers have had power supplies that were large enough to provide power for a maximum of all of the solenoids being turned on at the same time to drive their armatures simultaneously. This type of driver required a relatively large amount of power to operate with attendant problems such as excessive weight and heat dissipation. State of the art solenoid drivers are of the switching regulator variety but utilize a power switch for each solenoid so that the number of power switches equals the number of solenoids. This type of driver requires much less power but has the disadvantage of a relatively large amount of circuitry.

Not only does this invention provide a greatly reduced power requirement, but also greatly reduces the number of components by using a single power switch for all of the solenoids and by selecting values of inductance for the solenoids such that a quiesent current is reached or nearly reached at a predetermined time.

BRIEF SUMMARY OF THE INVENTION

A switch mode driver activates selected print wires of a wire matrix printer by activating the coils of corresponding solenoids whose armatures activate the print wires. Enable signals are provided by a logic device such as a microprocessor for selecting the particular solenoids to be activated to form a given character. The enable signals are provided for a time sufficient to cover a slewing period during which the current is initially ramped through the solenoids, and a chopping period during which a quiescent current is maintained by periodically turning the power switch on and off, thereby connecting and disconnecting the selected solenoids from the DC power source. In this preferred embodiment, the power source is connected approximately 10% of the time during the chopping period.

An RC circuit is connected to one input of a comparator whose other input is connected to a reference voltage. The RC time constant is selected so that the output of the comparator remains high turning on the power switch for a period of time sufficient for the solenoid current to reach its quiescent work state. This is known as the slewing period. When the charge on the capacitor of the RC circuit reaches a particular value relative to the reference voltage, the output of the comparator goes low, thereby opening the power switch. Then the chopping period begins and the capacitor of the RC circuit begins discharging until its charge decreases to a predetermined value to again cause the output of the comparator to go high turning the power switch on. This chopping action then continues until the enable inputs are timed out.

An enabling circuit responds to the enable signals and provides a switch for each of the solenoid coils. Each of the switches is selected by the enable input signals. During the slewing period, the ramping current through the selected solenoids is conducted through the associated switch, through a sensing resistor, through the DC power source and through the power switch back to the selected solenoids. When the power switch is open during the chopping period, the current comes from the particular solenoids, passes through the associated switches to a reference potential, from that reference potential through a commutating diode back to the selected solenoids. When the power switch is open, then, it is obvious that the power source is removed from the circuit.

At the end of the chopping period, the enable signals are timed out, the capacitor of the RC circuit is immediately discharged and the output of the comparator is immediately brought low, suddenly opening the power switch. With the individual switches of the solenoids disabled because of the time out of the enable signals, clamping diodes corresponding to the selected solenoids conduct current back into the DC power source. There is one diode provided for each solenoid.

In this preferred embodiment, a positive feedback resistor is connected to the reference input of the comparator for adjusting the reference voltage to provide a longer time for the RC circuit to reach the reference, as determined by the number of solenoids that have been activated. That is, when all of the solenoids have been activated, the longest time is required.

Also provided is a sensing resistor that is connected to a safety circuit for turning off the power switch if an excess current is conducted through the sensing resistor.

The principal object of this invention is to provide a switch mode driver for one or more solenoids that has a single power switch and that operates on substantially reduced power.

Another object of this invention is to provide a switch mode driver that requires a relatively low voltage from a DC power source.

Still another object is to provide a switch mode driver that has a low duty cycle of power-on during its chopping period.

A further object is to provide a switch mode driver that requires a progressively longer slewing period as the number of solenoids selected increases.

These and other objects will become apparent in the detailed description that follows.

BRIEF DESCRIPTION OF THE DRAWINGS

The sole FIGURE is a schematic diagram of the switch mode driver of this invention.

DETAILED DESCRIPTION OF THE INVENTION

Input enable signals SF1 through SF7 are brought into the circuit through open collector gates A110-A116 whose outputs are connected, respectively, through resistors R126-R120 to +5 volts. Input open collector gates A117 and A118 have SF8 as a common enable input signal which causes the output of open collector buffers A117 and A118 to be high when any of SF1 through SF7 enable signals are present. Open collector gates A110 through A118 are manufactured by Texas Instruments Incorporated and are Type 7417 whose description begins on page 6-24 of the Texas Instruments Incorporated "The TTL Data Book," copyright 1976.

The outputs of open collector gates A110 through A117 are connected to the bases of Darlington switches Q110 through Q116 respectively. These Darlington switches are manufactured by Sprague, type ULN206 found on page 4-30 of the Sprague Integrated Circuits Data Book, copyright 1978. The emitters of transistors Q110-Q116 are tied together and connected to a ground return through sensing resistor R102. Resistor R117 has one end connected to the emitters of transistors Q110-Q116 and the other end connected to the collector of transistor Q103. Resistor R103 has one end also connected to the emitters of transistors Q110-Q116 and has its other end connected to the base of transistor Q103 and also to one terminal of capacitor C101 whose other terminal is connected to the ground return. The emitter of transistor Q103 is connected through resistor R110 to the ground return.

The collector of transistor Q103 is connected to the reference input of comparator U107, through resistor R115 to the ground return, through hysterisis resistor R109 to the output of comparator U107, through resistor R114 and through resistor R128 to a +12 volt DC source, through capacitors C103 and C102 to the ground return and to the cathode of Zener diode CR115 whose anode is connected to the ground return. One operational voltage for comparator U107 is provided by the ground return and the other is provided from the junction of resistors R114 and R128.

Commutating diode CR114 has its anode connected to the ground return and its cathode connected to one end of solenoids T110-T116. Timing capacitor C104 is connected at one terminal to the ground return and at the other terminal to the output of gate A118, to one end of timing resistor R105 whose other end is connected to the cathode of diode CR114, and to the other input of comparator U107. The output of U107 is connected to the output of gate A117 whose output is also connected through resistor 127 to +5 volts.

The other ends of solenoid coils T110-T116 are connected to the collectors of Darlington switches Q110-Q116 respectively and also to the anodes of diodes CR105-CR111 respectively, whose cathodes are connected through fuse F102 to a +33 volts DC power source. Power transistor Q101 is a type TIP 105 Darlington connected silicon power transistor manufactured by Texas Instruments Incorporated and described in Texas Instruments Bulletin No. DL-S 7712483, released January 1977. Power transistor Q101 has its emitter connected through fuse F102 to the +33 volts DC power source and through resistor R101 to its base. Its collector is connected to the one end of the solenoids T110 through T116. Also connected to the collector of transistor Q101 is the cathode of diode CR112 whose anode is connected through resistor R108 to the other input of comparator U107. The base of transistor Q101 is connected to the collector of transistor Q102 whose base is connected through resistor R104 to +5 volts. The emitter of resistor Q105 is connected through resistor R111 to the collector of transistor Q104. The base of transistor Q104 is connected through resistor R112 to the output of comparator U107. The emitter of transistor Q104 is connected to the ground return.

PREFERRED MODE OF OPERATION

Any one or all of enable signals SF1-7 may be present as determined by the particular character that is to be printed. The microprocessor mentioned above (not shown) provides these signals. In corresponding open collector gates A110-A116, in combination with the +5 volt source through corresponding resistors R120-R126, a voltage level sufficient to turn on corresponding Darlington switches Q110-Q116 is present.

At the same time, the input SF8 to open collector gates A117 and A118 is provided to insure a high output from gates A117 and A118. Signals SF1 through SF8 (as selected) remain present, in this embodiment, for a period of 400 microseconds.

For purposes of illustration, assume that print needles corresponding to solenoids T110, T113 and T116 must be activated. Then Darlington switches Q110, Q113 and Q116 must be turned on by the outputs of gates A110, A113 and A116, respectively. At the same time, the high output from gate A117, connected to the output of comparator U107 keeps that point positive to the extent that the base of transistor Q104 is also positive so that conduction of Q104 begins. Transistor Q104 then serves as a current sink for transistor Q102 which has +5 volts applied to its base, thereby causing the conduction of transistor Q102. The main power switch transistor Q101 has its emitter connected to +33 volts and its base connected through resistor R105 also to +33 volts. However, when transistor Q102 begins conducting, the base voltage on the PNP transistor Q101 becomes negative with respect to the emitter and transistor Q101 begins conduction. Current is conducted through the collector of transistor Q101, through each of solenoids T110, T113 and T116 into the common emitter circuit of transistors Q110, Q113 and Q116, through sensing resistor R102 to the ground return and back through the +33 volt power source to the mitter of transistor Q101. The current through each of solenoids T110, T113 and T116 ramps upwardly to ultimately reach a quiescent value of approximately 1.5 amperes. The initial inductance of the solenoids is chosen such that after approximately 200 microseconds of applied voltage, the solenoid current will reach that quiescent level. The 200 microsecond time period is determined by timing capacitor C104 and resistor R105. When the charge on C104 reaches approximately 2.6 volts, U107 provides a low output, reducing the base drive on transistor Q104, thereby turning off that transistor. When transistor Q104 turns off, transistor Q102 must also turn off. The base of transistor Q101 then returns to +33 volts turning off transistor Q101. The turning off of transistor Q101 effectively removes solenoids T110, T113 and T116 from the +33 volt DC power source. The current out of those solenoids now is conducted through transistors Q110, Q113 and Q116 respectively into their common emitter circuit and once again, through sensing resistor R102, to the ground return. From the ground return the current passes through commutation diode CR114 back into solenoids T110, T113 and T116.

The reference input of comparator U107 has its voltage established by the circuit from the +12 volt DC supply, through resistor R128, through resistor R114 to the junction between resistor R115 and R117, R115 being tied to the ground return and R117 being connected through sensing resistor R102 to the ground return. When only one solenoid is selected, then only 1.5 amps flow through resistor R102 which is a 0.1 ohm resistor, thereby providing only a 0.15 volt drop. This puts resistors R115 and R117 essentially in parallel and establishes a reference of approximately 2.6 volts. However, if all seven solenoids are selected, then over 10 amps flow through resistor R102 and more than 1.0 volt is dropped across that sensing resistor. Under those conditions, resistors R117 and R115 are no longer essentially in parallel and the voltage on the reference rises from 2.6 to some higher level. The time required for C104 to charge to that higher level is greater than when a single solenoid has been selected.

The original period when the current is ramping through solenoids T110, T113 and T116 is known as a slewing period. The values of resistor R105 and capacitor C104 are selected to provide a slewing period of approximately 200 microseconds which is an adequate average time to provide a quiescent value of current in each of solenoids T110, T113 and T116. The current flowing through resistor R102 is approximately 4.5 amps and the drop across that sensing resistor is approximately 0.45 volts. When the charge on capacitor C104 rises to the level of the reference voltage on comparator U107, comparator U107 is turned on, turning off transistor Q104, and ultimately transistor Q101, as mentioned above. This ends the slewing period.

Transistor Q101 is turned off, and the current paths for solenoids T110, T113 and T116 are as described above, eliminating the +33 volt DC power source. Since there is a substantial L/R time constant, this current continues to flow until C104 is discharged to approximately 2.5 volts. At that time, the output transistor Q101 conducts current through solenoids T110, T113, and T116, through transistor Q110, Q113 and Q116 into their common emitter connection, again through resistor R102 into the +33 volt DC power source and back through power transistor Q101. At the same time, capacitor C104 is again charging and when the value of approximately 2.6 volts is reached on that capacitor, U107 again goes low, opening transistor switch Q101. In this preferred embodiment, transistor Q101 is closed approximately 10% of the chopping period which begins after the initial slewing period during which the current ramps up to its nominal 1.5 ampere value through each selected solenoid. During the chopping period, which is set at 200 microseconds in this preferred embodiment, the duty cycle is at 10% which essentially provides an average input voltage of 3.3 volts. This duty cycle is determined mainly by resistor R105 and resistor R108, together with the comparator hyststeresis resistor R109. Resistor R109 provides positive feedback to comparator U107, adjusting the reference potential. Resistor 108 and blocking diode CR112 provide another discharge path for timing capacitor C104, thus determining the length of the off-time during the chopping period.

By the proper selection of value for resistor R108, the quiescent current through the solenoids can be effectively lowered (by changing the off-time) to track the reduced air gap as the armature is activated.

Protective current sensing is provided to maintain an average current level of 6 amps or less through sensing resistor R102 over a ten millisecond averaging interval. Capacitor C101 is charged through resistor R103 as determined by the drop across resistor R102. When the charge on capacitor C101 reaches +0.6 volts, transistor Q103 begins conducting which then reduces the comparator reference voltage input, reducing the maximum allowable on-time of power switch transistor Q101, effectively reducing the solenoid current. This current limiting feature is important to protect the hardware during brief periods of fault mode operation brought on by such events as line transients or jammed solenoid armatures.

After the chopping period has been terminated by reason of the enable signals being dropped after 400 microseconds normal print cycle time, the outputs of open collector gates A117 and A118 are brought low, rapidly discharging capacitor C104 and bringing the base potential on transistor Q104 to the ground return level and rapidly turning off the power switch transistor. Transistor switches Q110, Q113 and Q116 are turned off and current from solenoids T110, T113 and T116 is returned to the power supply through the commutation diode CR114, the solenoid inductance and the clamp diodes CR105, CR108 and CR111. Approximately 150 microseconds is required to recover the energy, thereby allowing a new selection of solenoids 550 microseconds from the beginning of the last print cycle.

The specific implementation, time periods and configuration of wire matrix heads may readily be changed by those skilled in the art without departing from the scope of this invention.

What is claimed is:

1. A wire matrix switch mode driver for connection to a DC source of power for driving the armatures of a plurality of solenoids that are selectively connected across and disconnected from the DC source, including means for providing enable signals for a predetermined time for selecting each solenoid, comprising:
   (a) enabling means connected to the plurality of solenoids and operatively connected to receive the enable signals and responsive thereto to provide a current path for each of the selected solenoids both when the plurality of solenoids is connected across the DC source and when it is disconnected from the DC source;
   (b) a power switch adapted to drive any or all of the plurality of solenoids, connected to the DC source of power and to the plurality of solenoids, and having control means for permitting the power switch to close, thereby connecting the plurality of solenoids to the DC source and for permitting the power switch to open, thereby disconnecting the plurality of solenoids from the DC source; and
   (c) timing means responsive to the means for providing enable signals and connected to the control means to permit the power switch to open after it has been closed a predetermined time, and to close after it has been open a predetermined time.

2. The driver of claim 1 wherein the enabling means comprises:
   (a) (i) a plurality of switches, each connected to a respective one of the plurality of solenoids and to one side of the DC source; and
   (ii) a current return path connected to the one side of the DC source, operable when the power switching means is open to provide a path for current from the one side of the DC source to the plurality of solenoids.

3. The driver of claim 1 wherein the power switching means comprises a power transistor.

4. The driver of claim 1, further comprising a plurality of clamp diodes connected to respective ones of the plurality of solenoids and to the other side of the DC source for conducting current from the selected solenoids when the predetermined time for selecting the solenoids has expired.

5. The driver of claim 2 wherein the power switching means comprises a power transistor.

6. A wire matrix switch mode driver for connection to a DC source of power for driving the armatures of a plurality of solenoids that are selectively connected across and disconnected from the DC source, including means for providing enable signals for a predetermined time for selecting each solenoid, comprising:

(a) enabling means connected to the plurality of solenoids and operatively connected to receive the enable signals and responsive thereto to provide a current path for each of the selected solenoids both when the plurality of solenoids is connected across the DC source and when it is disconnected from the DC source;

(b) power switching means connected to the DC source of power and to the plurality of solenoids, and having control means for permitting the power switching means to close, thereby connecting the plurality of solenoids to the DC source and for permitting the power switching means to open, thereby disconnecting the plurality of solenoids from the DC source; and (c) timing means responsive to the means for providing enable signals and connected to the control means to permit the switching means to open after it has been closed a predetermined time, and to close after it has been open a predetermined time wherein the timing means comprises:
(i) an RC circuit, connected to the enabling means; and
(ii) comparator means having a first input connected to the enabling means for establishing a reference voltage, and a second input connected to the RC circuit for providing an output signal to permit the power switching means to open when the first and second voltages reach a prescribed difference in magnitude.

7. A wire matrix switch mode driver for connection to a DC source of power for driving the armatures of a plurality of solenoids that are selectively connected across and disconnected from the DC source, including means for providing enable signals for a predetermined time for selecting each solenoid, comprising:

(a) enabling means connected to the plurality of solenoids and operatively connected to receive the enable signals and responsive thereto to provide a current path for each of the selected solenoids both when the plurality of solenoids is connected across the DC source and when it is disconnected from the DC source;

(b) a power transistor connected to the DC source of power and to the plurality of solenoids, and having control means for enabling the power transistor, thereby connecting the plurality of solenoids to the DC source and for disabling the power transistor, thereby disconnecting the plurality of solenoids from the DC source; and (c) timing means responsive to the means for providing enable signals and connected to the control means to disable the power transistor after it has been enabled a predetermined time, and to enable it after it has been disabled a predetermined time wherein the timing means comprises:
(i) an RC circuit, connected to the enabling means; and
(ii) comparator means having a first input connected to the enabling means for establishing a reference voltage, and a second input connected to the RC circuit for providing an output signal to disable the power transistor when the first and second input voltages reach a prescribed difference in magnitude.

8. The driver of claim 7 wherein the timing means further comprises a blocking diode having a cathode connected to the collector of the power transistor and a resistor having one end connected to the anode of the blocking diode and its other end connected to the RC circuit for providing a discharge path for the capacitor of the RC circuit.

9. The driver of claim 8 wherein the enabling means comprises:
(a) (i) a plurality of switches, each connected to a respective one of the plurality of solenoids and to one side of the DC source; and
(ii) a current return path connected to the one side of the DC source, operable when the power switching means is open to provide a path for current from the one side of the DC source to the plurality of solenoids.

10. The driver of claim 9 wherein the enabling means further comprise:
(a) (iii) a current sensing resistor connected in series in the current return path;
(iv) an RC circuit connected to the sensing resistor for establishing a critical voltage over a predetermined time; and
(v) a transistor having its base connected to the RC circuit and its collector connected to the reference voltage input of the comparator for reducing the reference voltage when the voltage on its base reaches the critical value turning the transistor on.

11. A wire matrix switch mode driver for connection to a DC source of power for driving the armatures of a plurality of solenoids that are selectively connected across and disconnected from the DC source, including means for providing enable signals for a predetermined time for selecting each solenoid, comprising:

(a) enabling means connected to the plurality of solenoids and operatively connected to receive the enable signals and responsive thereto to provide a current path for each of the selected solenoids both when the plurality of solenoids is connected across the DC source and when it is disconnected from the DC source, the enabling means comprising:
(i) a plurality of switches, each connected to a respective one of the plurality of solenoids and to one side of the DC source;
(ii) a current return path connected to the one side of the DC source, selectively operable to provide a path for current from the one side of the DC source to the plurality of solenoids;

(b) a power transistor connected to the DC source of power and to the plurality of solenoids, and having control means for enabling the power transistor, thereby connecting the plurality of solenoids to the DC source and for disabling the power transistor, thereby disconnecting the plurality of solenoids from the DC source; and (c) timing means responsive to the means for providing enable signals and connected to the control means to disable the power transistor after it has been enabled a predetermined time and to enable it after it has been disabled for a predetermined time.

12. The driver of claim 11 further comprising a plurality of clamp diodes connected to respective ones of the plurality of solenoids and to the other side of the DC source for conducting current from the selected solenoids when the redetermined time for selecting the solenoids has expired.

* * * * *